(12) United States Patent
Han et al.

(10) Patent No.: US 11,672,141 B2
(45) Date of Patent: *Jun. 6, 2023

(54) DISPLAY APPARATUS

(71) Applicant: SAMSUNG DISPLAY CO., LTD., Yongin-si (KR)

(72) Inventors: Junghoon Han, Yongin-si (KR); Kwansu Kim, Yongin-si (KR); Yongjin Kim, Yongin-si (KR); Jiseok Ryu, Yongin-si (KR); Jinwoo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/841,347

(22) Filed: Apr. 6, 2020

(65) Prior Publication Data

US 2020/0235339 A1 Jul. 23, 2020

Related U.S. Application Data

(63) Continuation of application No. 15/387,570, filed on Dec. 21, 2016, now Pat. No. 10,615,366.

(30) Foreign Application Priority Data

Mar. 11, 2016 (KR) .......................... 10-2016-0029691

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 27/3276* (2013.01);
(Continued)

(58) Field of Classification Search
None
See application file for complete search history.

(56) References Cited

U.S. PATENT DOCUMENTS

| 5,293,025 A | 3/1994 | Wang |
| 6,940,166 B2 | 9/2005 | Iseda et al. |

(Continued)

FOREIGN PATENT DOCUMENTS

| CN | 1069157 A | 2/1993 |
| CN | 1523652 A | 8/2004 |

(Continued)

OTHER PUBLICATIONS

EPO Extended Search Report dated Jul. 19, 2017, for corresponding European Patent Application No. 17160194.1 (10 pages).

(Continued)

*Primary Examiner* — Frank J Vineis
*Assistant Examiner* — Nicole T Gugliotta
(74) *Attorney, Agent, or Firm* — Lewis Roca Rothgerber Christie LLP

(57) ABSTRACT

A display apparatus includes a substrate including a bent area between a first area and a second area, and bent about a bending axis, a display unit over an upper surface of the substrate at the first area, and a protective film over a lower surface of the substrate that is opposite to the upper surface, and including an opening corresponding to the bent area, wherein an inner side surface of the opening is inclined with respect to the lower surface of the substrate.

9 Claims, 10 Drawing Sheets

(51) Int. Cl.
*H01L 51/00* (2006.01)
*G09F 9/30* (2006.01)
(52) U.S. Cl.
CPC .. *H01L 51/0097* (2013.01); *H01L 2251/5338* (2013.01); *Y02E 10/549* (2013.01); *Y02P 70/50* (2015.11)

(56) References Cited

U.S. PATENT DOCUMENTS

| | | | |
|---|---|---|---|
| 7,486,368 | B2 | 2/2009 | Sakakura et al. |
| 7,625,779 | B2 | 12/2009 | Takahashi |
| 7,989,320 | B2 | 8/2011 | Boyle et al. |
| 9,048,443 | B2 | 6/2015 | Namkung et al. |
| 9,189,027 | B2 | 11/2015 | Lee et al. |
| 9,203,050 | B2 | 12/2015 | Jeong et al. |
| 9,274,559 | B2 | 3/2016 | Prushinskiy et al. |
| 9,614,167 | B2 | 4/2017 | Jeong et al. |
| 10,615,366 | B2 * | 4/2020 | Han ................. H01L 27/3244 |
| 2004/0159943 | A1 | 8/2004 | Iseda et al. |
| 2009/0207712 | A1 | 8/2009 | Seto et al. |
| 2011/0050657 | A1 | 3/2011 | Yamada |
| 2012/0113614 | A1 | 5/2012 | Watanabe |
| 2013/0169515 | A1 | 7/2013 | Prushinskiy et al. |
| 2014/0042406 | A1 | 2/2014 | Degner et al. |
| 2014/0183473 | A1 | 7/2014 | Lee et al. |
| 2015/0014644 | A1 * | 1/2015 | Namkung ............. H01L 51/56 257/40 |
| 2015/0049428 | A1 | 2/2015 | Lee et al. |
| 2015/0102298 | A1 | 4/2015 | Namkung et al. |
| 2015/0131237 | A1 | 5/2015 | Chen et al. |
| 2015/0146386 | A1 | 5/2015 | Namkung et al. |
| 2015/0147532 | A1 | 5/2015 | Nam et al. |
| 2015/0188091 | A1 | 7/2015 | Kudo et al. |
| 2015/0227172 | A1 * | 8/2015 | Namkung ........... H01L 27/3267 345/173 |
| 2015/0255522 | A1 | 9/2015 | Sato et al. |
| 2016/0093683 | A1 | 3/2016 | Lee et al. |
| 2016/0275830 | A1 * | 9/2016 | You .................. G02F 1/133305 |
| 2017/0263887 | A1 | 9/2017 | Han et al. |
| 2019/0040215 | A1 * | 2/2019 | Murata ................. B29C 59/16 |
| 2019/0293921 | A1 | 9/2019 | Nam et al. |

FOREIGN PATENT DOCUMENTS

| | | |
|---|---|---|
| CN | 1578546 A | 2/2005 |
| CN | 1638108 A | 7/2005 |
| CN | 1816908 A | 8/2006 |
| CN | 101449324 A | 6/2009 |
| CN | 103317298 A | 9/2013 |
| CN | 104183620 A | 12/2014 |
| CN | 104424851 A | 3/2015 |
| CN | 104680941 A | 6/2015 |
| CN | 104885140 A | 9/2015 |
| EP | 2806475 A2 | 11/2014 |
| EP | 2840460 A1 | 2/2015 |
| JP | 2015-169711 A | 9/2015 |
| KR | 10-2013-0076402 | 7/2013 |
| KR | 10-2014-0085956 | 7/2014 |
| KR | 10-2015-0007632 | 1/2015 |
| KR | 10-2015-0043647 | 4/2015 |
| KR | 10-2015-0061965 | 5/2015 |
| KR | 10-2015-0062237 | 6/2015 |
| KR | 10-2016-0111839 | 9/2016 |
| KR | 10-1797728 | 11/2017 |
| TW | 201417267 A | 5/2014 |

OTHER PUBLICATIONS

KIPO Office Action dated Mar. 20, 2017, for corresponding Korean Patent Application No. 10-2016-0029691 (6 pages).
Chinese Office action issued in corresponding application No. CN 202011576051.0, dated May 26, 2022, 13 pages.

* cited by examiner

DISPLAY APPARATUS

CROSS-REFERENCE TO RELATED APPLICATIONS

This application is a continuation of U.S. patent application Ser. No. 15/387,570, now U.S. Pat. No. 10,615,366, filed Dec. 21, 2016, which claims priority to and the benefit of Korean Patent Application No. 10-2016-0029691, filed Mar. 11, 2016, the entire content of both of which is incorporated herein by reference.

BACKGROUND

1. Field

One or more embodiments relate to a display apparatus capable of reducing manufacturing costs and a defective rate during manufacturing processes.

2. Description of the Related Art

In general, a display apparatus includes a display unit on a substrate. In such a display apparatus, at least a part of the display apparatus may be bent to improve visibility from various angles, and to reduce an area of a non-display area.

However, in the related art, defects may occur during manufacture of a display apparatus that is bent, or manufacturing costs may excessively increase to produce the display apparatus that is bent.

SUMMARY

One or more embodiments include a display apparatus capable of reducing a defect rate during manufacturing processes, and capable of reducing manufacturing costs.

Additional aspects will be set forth in part in the description that follows and, in part, will be apparent from the description, or may be learned by practice of the presented embodiments.

According to one or more embodiments, a display apparatus includes a substrate including a bent area between a first area and a second area, and bent about a bending axis, a display unit over an upper surface of the substrate at the first area, and a protective film over a lower surface of the substrate that is opposite to the upper surface, and including an opening corresponding to the bent area, wherein an inner side surface of the opening is inclined with respect to the lower surface of the substrate.

The display apparatus may further include an adhesive layer integrally formed throughout the first area, the bent area, and the second area between the substrate and the protective film.

A portion of the adhesive layer corresponding to the opening may have a thickness that is less than a thickness of a portion of the adhesive layer between the substrate and the protective film.

A portion of the protective film that is adjacent the opening may have a gradually decreasing thickness in a direction toward the opening.

The gradually decreasing thickness may decrease at an inconsistent rate.

The gradually decreasing thickness may decrease at a decreasing rate in the direction toward the opening.

The protective film may include a first portion having a constant thickness, a second portion adjacent the opening, and having a thickness that gradually decreases in a direction toward the opening, and a third portion between the first portion and the second portion, and having a thickness that is greater than the thickness of the first portion.

The bent area may be in the opening.

The opening may be in the bent area.

According to one or more embodiments, a display apparatus includes a substrate including a bent area between a first area and a second area, and bent about a bending axis, a display unit over an upper surface of the substrate in the first area, and a protective film over a lower surface of the substrate that is opposite to the upper surface, and including a concave portion corresponding to the bent area.

The concave portion of the protective film may have a first part where a thickness of the concave portion gradually decreases toward a center of the concave portion.

The thickness of the concave portion in the first part may decrease toward the center of the concave portion at an inconsistent rate.

The thickness of the concave portion in the first part may have a subpart where the thickness of the concave portion decreases toward the center of the concave portion at a decreasing rate.

The concave portion of the protective film may have a second part where the thickness of the concave portion is constant.

The second part may correspond to the center of the concave portion.

The protective film may include a first portion having a constant thickness, and a third portion between the first portion and the concave portion having a thickness that is greater than the thickness of the first portion.

The bent area may be in the concave portion.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
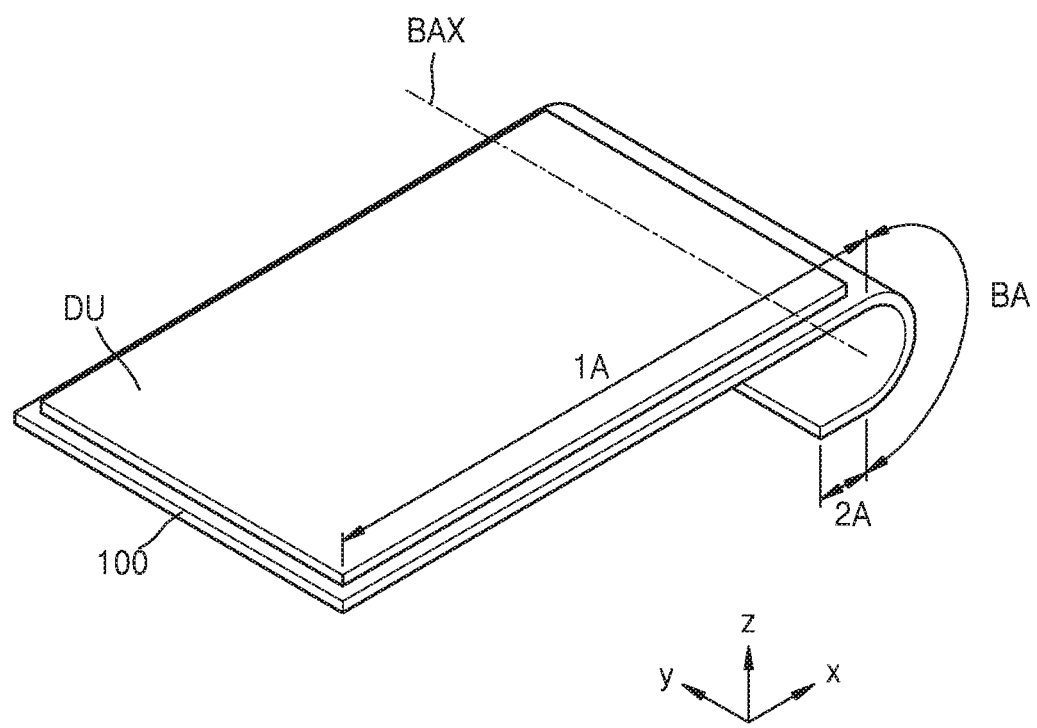
FIG. 1 is a schematic perspective view of a part of a display apparatus according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not suitable to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a part of a display apparatus according to an embodiment. In the display apparatus according to the embodiment, a substrate 100 that is a part of the display apparatus is partially bent, and thus, the display apparatus also has a partially bent shape like the substrate 100.

As shown in FIG. 1, the substrate 100 of the display apparatus according to the embodiment includes a bent area BA extending in a first direction (+y direction). The bent area BA is located between a first area 1A and a second area 2A in a second direction (+x direction) crossing the first direction. In addition, the substrate 100 is bent about a bending axis BAX that extends in the first direction (+y direction) as shown in FIG. 1. In the bent area BA, tensile stress may be applied to an upper surface (an outer surface) of the substrate 100 and compressive stress may be applied to a lower surface (an inner surface) of the substrate 100. The substrate 100 may include various materials having flexible or bendable characteristics, e.g., polymer resins such as polyethersulphone (PES), polyacrylate (PAR), polyetherimide (PEI), polyethylene napthalate (PEN), polyethyleneterephthalate (PET), polyphenylene sulfide (PPS), polyarylate, polyimide (PI), polycarbonate (PC), and cellulose acetate propionate (CAP). A display unit DU including a display device and a thin film transistor may be located at the first area 1A. If necessary, the display unit DU may be extended to the bent area BA or even to the second area 2A.

Figure 2:
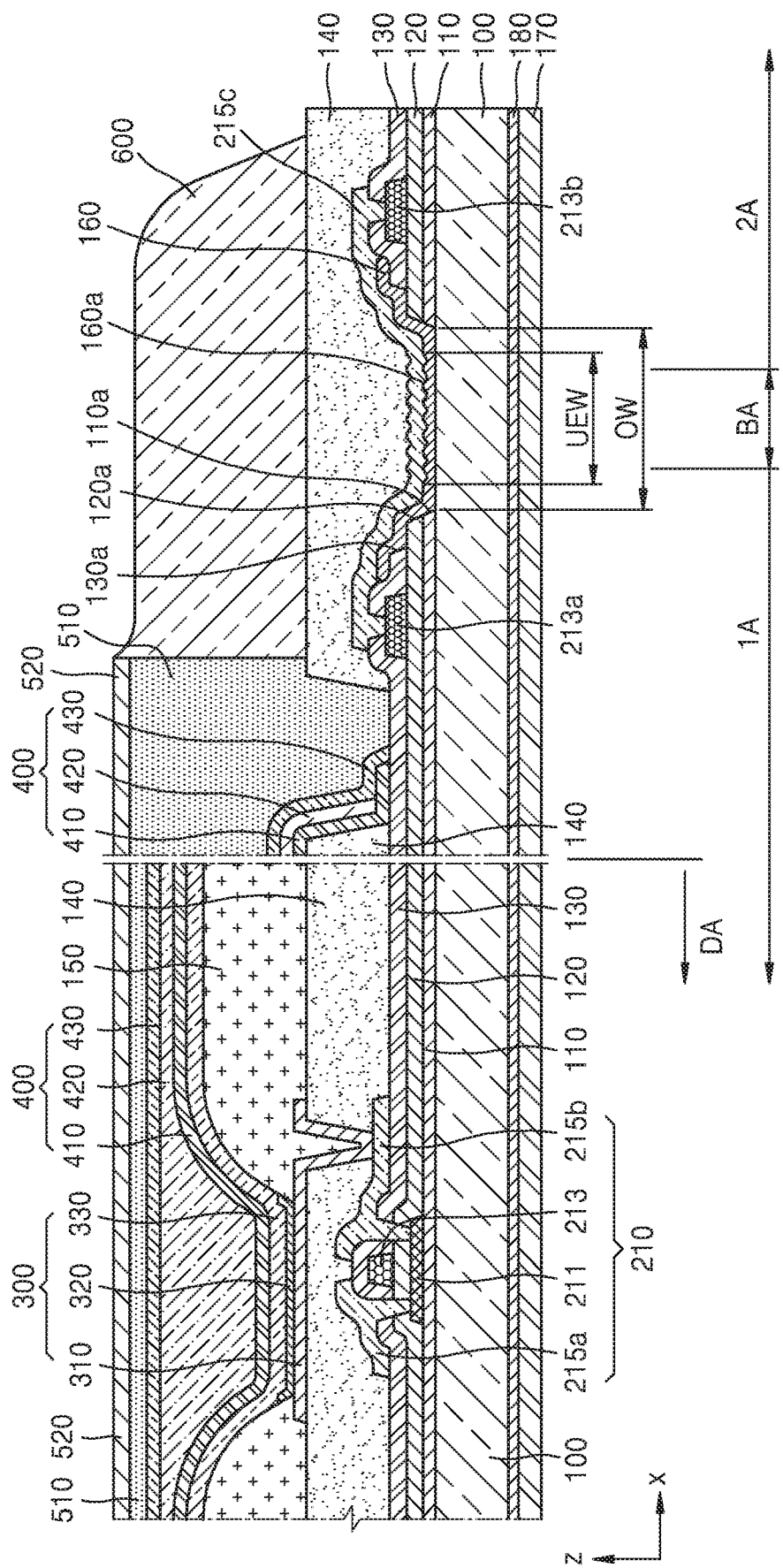
FIGS. 2 to 4 are schematic cross-sectional views of processes of manufacturing the display apparatus of FIG. 1.
Figure 3:
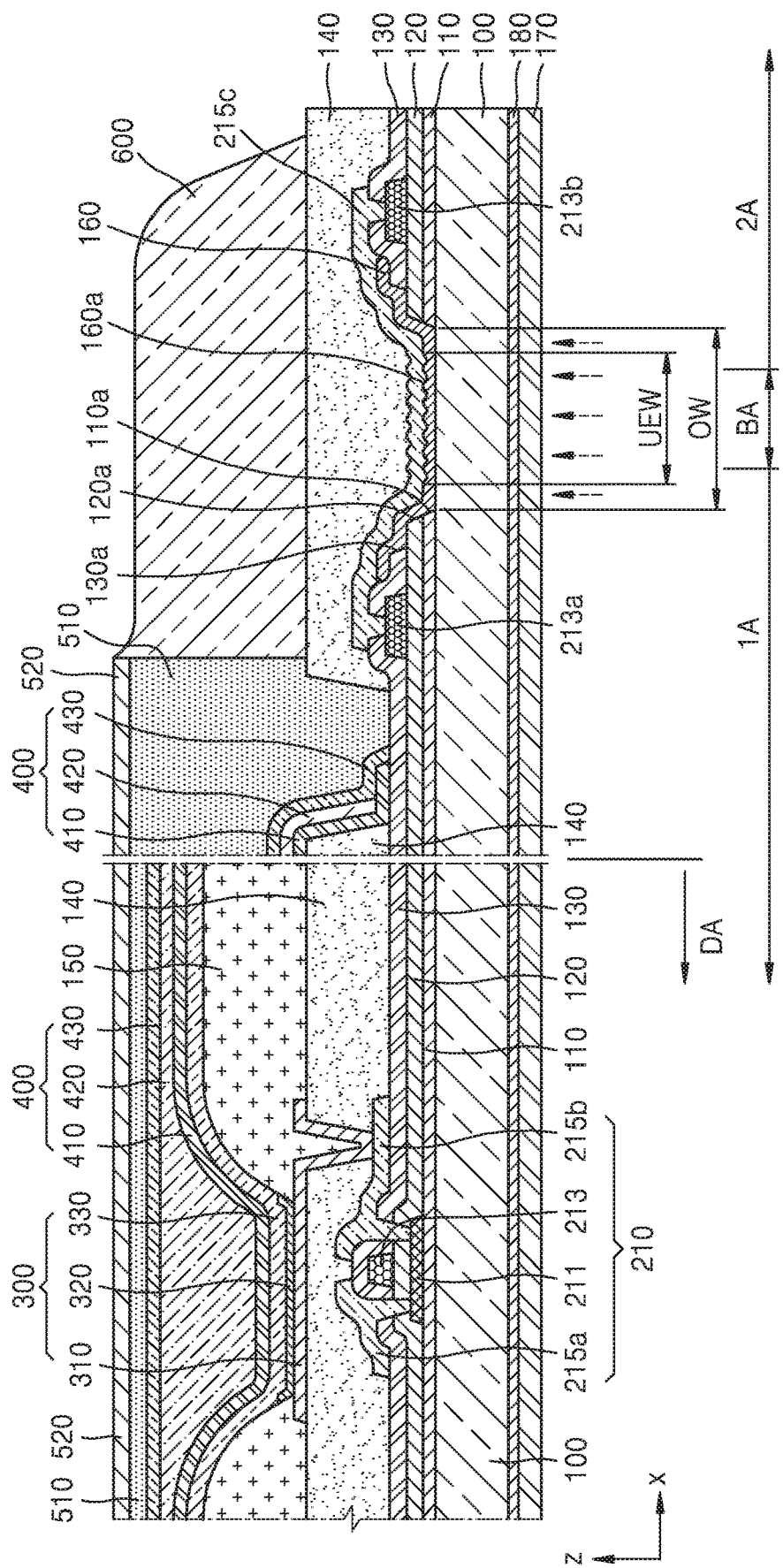
Figure 4:
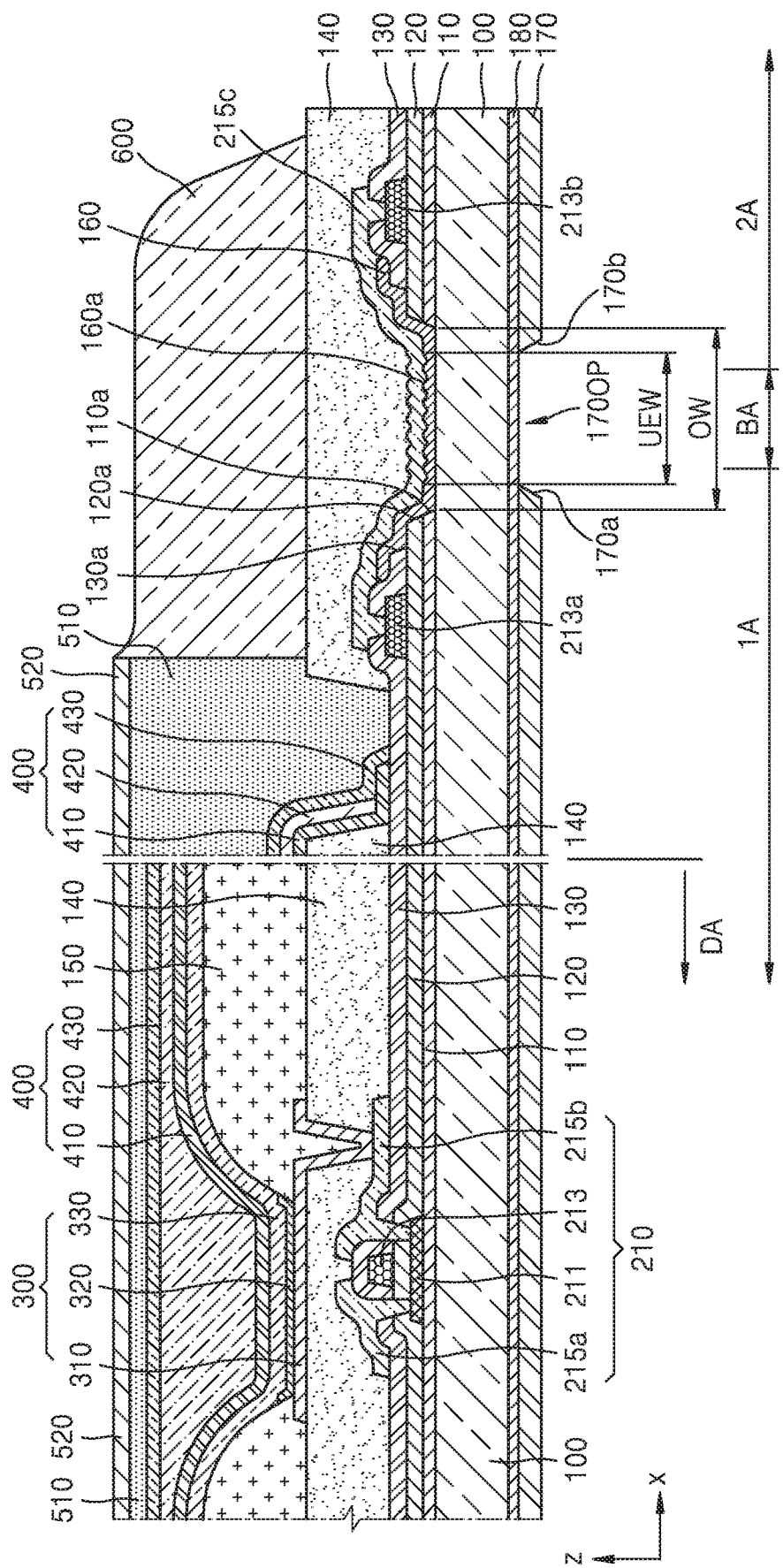

FIGS. 2 to 4 are schematic cross-sectional views of processes of manufacturing the display apparatus of FIG. 1. First, a display panel, as shown in FIG. 2, is prepared. As shown in FIG. 2, the first area 1A of the substrate 100 includes a display area DA. The first area 1A may further include a part of a non-display area at an outer portion of the display area DA, in addition to a part at the display area DA, as shown in FIG. 2. The second area 2A may also include the non-display area. A display unit including a display device, such as an organic light-emitting device 300, and also including a thin film transistor 210, may be located in the first area 1A. The substrate 100 includes the bent area BA between the first area 1A and the second area 2A so as to be bent at the bent area BA to have a shape as shown in FIG. 1.

The display panel includes a protective film 170 at a lower surface of the substrate 100, that is, in a direction (−z direction) that is opposite to a direction of the display unit (+z direction). The protective film 170 may be attached to the lower surface of the substrate 100 via an adhesive layer 180. A detailed structure of the display panel, to which the protective film 170 is attached, will be described in more detail below.

The thin film transistor 210, to which the organic light-emitting device 300 is electrically connected, may be in the display area DA of the display panel, similarly to the display device such as the organic light-emitting device 300. Electric connection of the organic light-emitting device 300 to the thin film transistor 210 may be understood that a pixel electrode 310 is electrically connected to the thin film transistor 210.

If suitable, a thin film transistor may also be at a peripheral area on the outer portion of the display area DA on the substrate 100. The thin film transistor on the peripheral area may be, for example, a part of a circuit unit for controlling electric signals applied to the display area DA.

The thin film transistor 210 may include a semiconductor layer 211 including amorphous silicon, polycrystalline silicon, or an organic semiconductor material. The thin film transistor 210 may also include a gate electrode 213, a source electrode 215a, and a drain electrode 215b. To ensure an insulating property between the semiconductor layer 211 and the gate electrode 213, a gate insulating layer 120 may be between the semiconductor layer 211 and the gate electrode 213, the gate insulating layer 120 including an inorganic material, such as silicon oxide, silicon nitride, and/or silicon oxynitride.

In addition, an interlayer insulating layer 130 may be on the gate electrode 213, and the source electrode 215a and the drain electrode 215b may be on the interlayer insulating layer 130, the interlayer insulating layer 130 including an inorganic material such as silicon oxide, silicon nitride, and/or silicon oxynitride. The insulating layers including the inorganic material (e.g., the gate insulating layer 120 and the interlayer insulating layer 130) may be formed through chemical vapor deposition (CVD) or atomic layer deposition (ALD). This will be applied to other embodiments and modifications thereof that will be described later.

A buffer layer 110 may be between the thin film transistor 210 and the substrate 100. The buffer layer 110 may include an inorganic material, such as silicon oxide, silicon nitride, and/or silicon oxynitride. The buffer layer 110 may improve smoothness of the upper surface of the substrate 100, or may prevent or reduce infiltration of impurities from the substrate 100 into the semiconductor layer 211 of the thin film transistor 210.

A planarization layer 140 may be arranged on the thin film transistor 210. For example, as shown in FIG. 2, when the organic light-emitting device 300 is arranged over the thin film transistor 210, the planarization layer 140 may planarize an upper portion of a protective layer that covers the thin film transistor 210, and the organic light-emitting device 300 may be arranged on the planarization layer 140. The planarization layer 140 may include, for example, an organic material such as acryl, benzocyclobutene (BCB), polyimide, and hexamethyldisiloxane (HMDSO). In FIG. 2, the planarization layer 140 has a single-layered structure, but the planarization layer 140 may be variously modified. For example, the planarization layer 140 may have a multi-layered structure.

In addition, as shown in FIG. 2, the planarization layer 140 may have an opening at an outer portion of the display area DA, so that a part of the planarization layer 140 in the display area DA and another part of the planarization layer 140 in the second area 2A may be physically separate from each other. Then, external impurities may be unable to reach the display area DA via the planarization layer 140.

In the display area DA, the organic light-emitting device 300 may be on the planarization layer 140, the organic light-emitting device 300 including the pixel electrode 310, an opposite electrode 330, and an intermediate layer 320 that is between the pixel electrode 310 and the opposite electrode 330 and that includes an emission layer. The pixel electrode 310 may contact one of the source electrode 215a and the drain electrode 215b via an opening formed in the planarization layer 140, and may be electrically connected to the thin film transistor 210, as shown in FIG. 2.

A pixel defining layer 150 may be on the planarization layer 140. The pixel defining layer 150 includes openings respectively corresponding to sub-pixels, that is, includes at least an opening exposing a center portion of the pixel electrode 310, to define pixels. Also, in the example shown in FIG. 2, the pixel defining layer 150 increases a distance between an edge of the pixel electrode 310 and the opposite electrode 330, which is above the pixel electrode 310, to prevent an arc, or electric short, from generating at the edge of the pixel electrode 310. The pixel defining layer 150 may include an organic material, for example, polyimide or HMDSO.

The intermediate layer 320 of the organic light-emitting device 300 may include low-molecular weight organic materials or polymer organic materials. When the intermediate layer 320 includes a low-molecular weight organic material, the intermediate layer may include a hole injection layer (HIL), a hole transport layer (HTL), an emission layer (EML), an electron transport layer (ETL), and/or an electron injection layer (EIL) in a single or multiple-layered structure. The low-molecular weight organic materials may be deposited by a vacuum deposition method.

When the intermediate layer 320 includes a polymer material, the intermediate layer 320 may include a hole transport layer (HTL) and an emission layer (EML). Here, the HTL may include PEDOT, and the EML may include a poly-phenylenevinylene (PPV)-based or polyfluorene-based polymer material. The intermediate layer 320 above may be formed by a screen printing method, an inkjet printing method, or a laser induced thermal imaging (LITI) method.

However, the intermediate layer 320 is not limited to the above example, and may have various structures. In addition, the intermediate layer 320 may include a layer that is integrally formed over a plurality of pixel electrodes 310, or may include a layer that is patterned to correspond to each of the plurality of pixel electrodes 310.

The opposite electrode 330 is arranged above the display area DA, and as shown in FIG. 2, may cover the display area DA. That is, the opposite electrode 330 may be integrally formed with respect to a plurality of organic light-emitting devices, so as to correspond to, or cover, a plurality of pixel electrodes 310.

Because the organic light-emitting device 300 may be easily damaged by external moisture or oxygen, an encapsulation layer 400 may cover the organic light-emitting device 300 to protect the organic light-emitting device 300. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 covers the opposite electrode 330, and may include silicon oxide, silicon nitride, and/or silicon oxynitride. If suitable, other layers, such as a capping layer, may be arranged between the first inorganic encapsulation layer 410 and the opposite electrode 330. Because the first inorganic encapsulation layer 410 is formed to have a shape corresponding to a structure thereunder, the first inorganic encapsulation layer 410 may have an uneven upper surface.

The organic encapsulation layer 420 covers the first inorganic encapsulation layer 410, and unlike the first inorganic encapsulation layer 410, the organic encapsulation layer 420 may have an even, or planar, upper surface. In more detail, the organic encapsulation layer 420 may have a roughly, or substantially, even upper surface at a portion corresponding to the display area DA. The organic encapsulation layer 420 may include at least one material selected from the group consisting of polyethylene terephthalate, polyethylene naphthalate, polycarbonate, polyimide, polyethylene sulfonate, polyoxymethylene, polyarylate, and hexamethyldisiloxane.

The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof at an outer portion of the display area DA, thereby preventing exposure of the organic encapsulation layer 420 to the outside.

As described above, because the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be disconnected, or may be stopped, between the first inorganic encapsulation layer 410 and the organic encapsulation layer 420, or between the organic encapsulation layer 420 and the second inorganic encapsulation layer 430. As such, forming of a path through which external moisture or oxygen may infiltrate into the display area DA may be prevented or reduced.

If suitable, processes of forming a touch electrode of various patterns for implementing a touch screen function, or of forming a touch protective layer for protecting the touch electrode on the encapsulation layer 400, may be further performed.

The display panel includes the protective film 170 on the lower surface of the substrate 100, that is, the surface that is in an opposite direction (−z direction) to the direction of the surface on which the display unit is located (+z direction). The protective film 170 may include polyethylene terephthalate (PET). As described above, the protective film 170 may be adhered to the lower surface of the substrate 100 via the adhesive layer 180. The adhesive layer 180 may include, for example, a pressure sensitive adhesive (PSA). A point in time at which the protective film 170 is attached to the lower surface of the substrate 100 may vary depending on circumstances.

For example, when a plurality of display units are formed on one mother substrate, a carrier substrate, which is solid, may be located under the mother substrate to easily handle the mother substrate, which has flexible or bendable characteristics, during the manufacturing processes. After forming the plurality of display units and the encapsulation layers 400 for encapsulating the display units on the mother substrate, the carrier substrate may be separated from the mother substrate. Otherwise, the carrier substrate may be separated from the mother substrate after forming a touch electrode and/or a touch protective layer for protecting the touch electrode on the encapsulation layers 400. In either case, after separating the carrier substrate from the mother substrate, the protective film 170 is attached to a surface of the mother substrate that contacted the carrier substrate. In this state, the mother substrate and the protective film 170 are cut to obtain a plurality of display panels. The substrate 100 may be understood as a substrate cut from the mother substrate.

After obtaining the plurality of panels by cutting the mother substrate and the protective film 170, a polarization plate 520 is attached to the encapsulation layer 400 by an optically clear adhesive (OCA) 510, and if suitable, a printed circuit board or an electronic chip may be attached to the second area 2A. If there is a touch electrode or a touch protective layer on the encapsulation layer 400, the OCA 510 and the polarization plate 520 may be located over the above elements. In addition, a bending protection layer (BPL) 600 may be at an outer portion of the display area or at a portion outside the display area.

Instead of obtaining the plurality of display panels at the same time from the mother substrate, a single display unit may be formed on one substrate 100. In this case, a carrier substrate that is solid may be located under the substrate 100 to easily handle the substrate 100 having flexible or bendable characteristics during the manufacturing processes. After forming the display unit and the encapsulation layer 400 for encapsulating the display unit on the substrate 100, the carrier substrate may be separated from the substrate 100. Otherwise, if suitable, after forming the touch electrode and/or the touch protective layer for protecting the touch electrode on the encapsulation layer 400, the carrier substrate may be separated from the substrate 100. In either case, after separating the carrier substrate from the substrate 100, the protective film 170 may be attached to the surface of the substrate 100 toward the carrier substrate. After that, the polarization plate 520 may be attached to the encapsulation layer 400 or to the touch protective layer via the OCA 510, and if suitable, a printed circuit board or an electronic chip may be attached to the second area 2A. In addition, the BPL 600 may be formed on an outer portion of the display area DA.

The polarization plate 520 may reduce reflection of external light. For example, when external light that passed through the polarization plate 520 is reflected by an upper surface of the opposite electrode 330, and that then passes through the polarization plate 520 again, the external light passes through the polarization plate 520 twice, and a phase of the external light may be changed. Therefore, a phase of reflected light is different from the phase of the external light entering the polarization plate 520 so that a destructive interference occurs. Accordingly, reflection of the external light may be reduced, and visibility of displayed images may be improved. The OCA 510 and the polarization plate 520 may cover the opening in the planarization layer 140, as shown in FIG. 2.

The method of manufacturing the display apparatus according to the embodiment need not include forming the polarization plate 520, and if suitable, the polarization plate 520 may be omitted or replaced with another component. For example, instead of attaching the polarization plate 520, a black matrix and a color filter may be formed to reduce the reflection of external light.

The BPL 600 may be over a first conductive layer 215*c*, corresponding at least to the bent area BA. When a stack structure is bent, there is a stress neutral plane in the stack structure. If there is no BPL 600, when the substrate 100 is bent, an excessive tensile stress may be applied to the first conductive layer 215*c* in the bent area BA, because the location of the first conductive layer 215*c* may not correspond to a stress neutral plane. However, by forming the BPL 600 and adjusting a thickness and a modulus of the BPL 600, a location of the stress neutral plane in the structure including the substrate 100, the first conductive layer 215*c*, and the BPL 600 may be adjusted. Therefore, the stress neutral plane may be adjusted to be around the first conductive layer 215*c* via the BPL 600, and thus, the tensile stress applied to the first conductive layer 215*c* may be reduced.

The BPL 600 may extend to an end of the substrate 100 in the display apparatus, unlike the example of FIG. 2. For example, in the second area 2A, the first conductive layer 215*c*, a second conductive layer 213*b*, and/or other conductive layers electrically connected to the first and second conductive layers 215*c* and 213*b* might not be covered at least partially by the interlayer insulating layer 130 or the planarization layer 140, but may instead be electrically connected to various electronic devices or printed circuit boards. Accordingly, the first conductive layer 215*c*, the second conductive layer 213*b*, and/or the other conductive layers electrically connected to the first and second conductive layers 215*c* and 213*b* may have portions that are electrically connected to the various electronic devices or to the printed circuit boards. Here, the electrically connected portions may be protected against external impurities such as moisture, and thus, the BPL 600 may cover the electrically connected portions to perform as a protective layer as well. To do this, the BPL 600 may extend to, for example, the end of the substrate 100 of the display apparatus.

In addition, in FIG. 2, an upper surface of the BPL 600 in a direction toward the display area DA (−x direction) coincides with an upper surface of the polarization plate 520 (in +z direction), but one or more embodiments are not limited thereto. For example, an end of the BPL 600 in a direction toward the display area DA (−x direction) may partially cover an upper surface of the polarization plate 520 at the edge of the polarization plate 520. Otherwise, the end of the BPL 600 in the direction toward the display area DA (−x direction) might not contact the polarization plate 520 and/or the OCA 510.

Referring to FIGS. 3 and 4, after attaching the protective film 170 to the lower surface of the substrate 100, a laser beam is irradiated to at least a portion of the protective film 170 corresponding to the bent area BA so that the protective film 170 may have an opening 170OP corresponding to the bent area BA, as shown in FIG. 4. In FIG. 4, the laser beam is irradiated to the portion of the protective film 170, wherein the portion of the protective film 170 corresponds to an uneven surface 160*a* of an organic material layer 160, which will be described later. Here, inner side surfaces 170*a* and 170*b* defining the opening 170OP are inclined with respect to the lower surface of the substrate 100. The opening 170OP may extend in the first direction (+y direction) such that a part of the protective film 170 corresponding to the first area 1A is separated from a part of the protective film 170 corresponding to the second area 2A. As shown in FIG. 4, after forming the opening 170OP in the protective film 170, the substrate 100 may be bent at the bent area BA so that the display panel may have the shape shown in FIG. 1.

Figure 5:
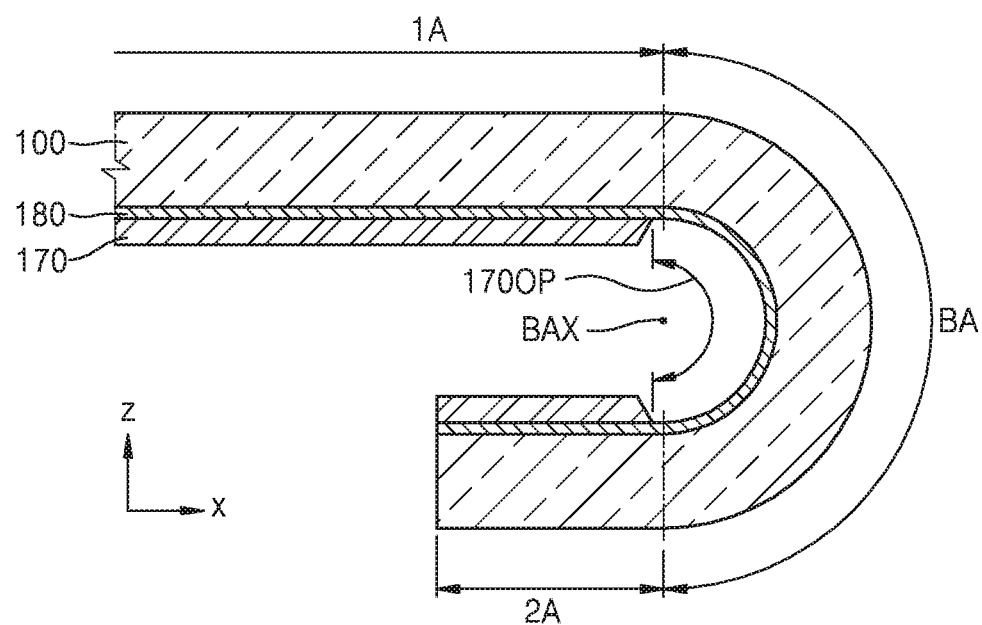
FIG. 5 is a schematic cross-sectional view of a part of the display apparatus of FIG. 1.

FIG. 5 is a schematic cross-sectional view of a part of the display apparatus of FIG. 1, and shows the substrate 100, the protective film 170, and the adhesive layer 180. As shown in FIG. 5, the substrate 100 may be bent at the bent area BA. The protective film 170 protects the lower surface of the substrate 100, and accordingly, may have a stiffness or rigidity of its own. Accordingly, when the substrate 100 is bent in a state where the protective film 170 has low flexibility, the protective film 170 may be otherwise separated from the substrate 100. However, according to the display apparatus of the embodiment, the protective film 170 includes the opening 170OP corresponding to the bent area BA. Accordingly, the separation between the protective film 170 and the substrate 100 may be effectively prevented.

In particular, in the display apparatus according to the embodiment, the inner side surfaces 170*a* and 170*b* of the opening 170OP in the protective film 170 are inclined with respect to the lower surface of the substrate 100. Accordingly, the thickness of the protective film 170 may decrease toward the opening 170OP. Accordingly, even when stress is generated at the portion adjacent to the opening 170OP of the protective film 170 as the substrate 100 is bent at the bent area BA, the amount of stress generated from the portion may be reduced due to the decreasing thickness of the protective film 170 toward the opening 170OP. Accordingly, the separation of the protective film 170 from the substrate 100 may be effectively prevented.

Figure 6:
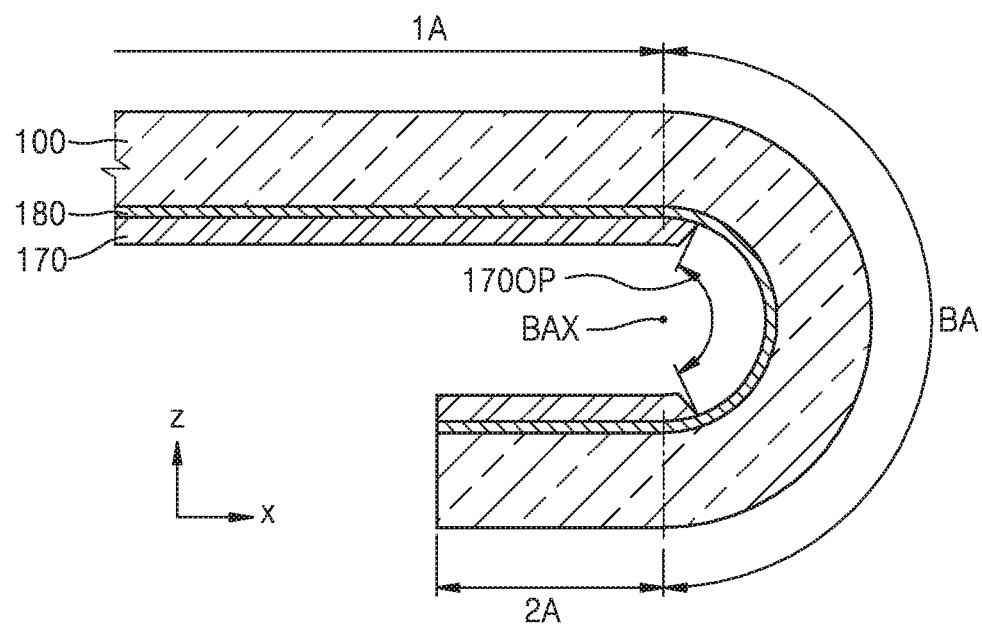
FIG. 6 is a schematic cross-sectional view of a part of a display apparatus according to an embodiment.

To reduce the stress applied to the protective film 170, the bent area BA may be located within the opening 170OP of the protective film 170, and it may be understood that an area of the opening 170OP in the protective film 170 is greater than that of the bent area BA, as shown in FIG. 5. However, one or more embodiments are not limited thereto. That is, as shown in FIG. 6, which is a schematic cross-sectional view of a part of a display apparatus according to an embodiment, the opening 170OP of the protective film 170 may be located within the bent area BA, meaning that the area of the bent area BA may be greater than that of the opening 170OP in the protective film 170. Even in the embodiment shown in FIG. 6, the thickness of the protective film 170 around the opening 170OP decreases toward the opening 170OP, as described above with respect to the embodiment shown in FIG. 5, and the stress generated from the opening 170OP may be reduced. Accordingly, separation of the protective film 170 from the substrate 100 may be effectively prevented.

In addition, the buffer layer 110, the gate insulating layer 120, and the interlayer insulating layer 130 including the inorganic material shown in FIGS. 2 to 4 may be referred to as a first inorganic insulating layer. The first inorganic insulating layer may include a first opening corresponding to the bent area BA, as shown in FIGS. 2 to 4. That is, the buffer layer 110, the gate insulating layer 120, and the interlayer insulating layer 130 may respectively include openings 110a, 120a, and 130a corresponding to the bent area BA. That the first opening corresponds to the bent area BA may denote that the first opening overlaps with the bent area BA. Here, an area of the first opening may be greater than that of the bent area BA. To do this, in FIGS. 2 to 4, a width OW of the first opening is greater than that of the bent area BA. Here, the area of the first opening may be defined as an area of one of the openings 110a, 120a, and 130a respectively of the buffer layer 110, the gate insulating layer 120, and the interlayer insulating layer 130 that has a smallest area or width. In addition, in FIGS. 2 to 4, the area of the first opening is described to be defined by an area of the opening 110a in the buffer layer 110.

In FIGS. 2 to 4, an inner side surface of the opening 110a of the buffer layer 110 and an inner side surface of the opening 120a in the gate insulating layer 120 are described to correspond to each other, but one or more embodiments are not limited thereto. For example, an area of the opening 120a of the gate insulating layer 120 may be greater than that of the opening 110a in the buffer layer 110. In this case, the area of the first opening may be also defined as an area of the one among a smallest of the openings 110a, 120a, and 130a of the buffer layer 110, the gate insulating layer 120, and the interlayer insulating layer 130, respectively.

As described above, when the display unit is formed, an organic material layer 160 that fills at least a part of the first opening of the first inorganic insulating layer is formed. In FIGS. 2 to 4, the organic material layer 160 completely fills the first opening. In addition, the display unit includes the first conductive layer 215c that extends from the first area 1A toward the second area 2A through the bent area BA, and that is over the organic material layer 160. The first conductive layer 215c may be on one of the inorganic insulating layers, such as the interlayer insulating layer 130, if the organic material layer 160 does not exist. The first conductive layer 215c may be formed during a same process as (e.g., simultaneously with) a source electrode 215a or a drain electrode 215b by using the same material as that of the source electrode 215a or the drain electrode 215b.

As described above, after forming the opening 170OP in the protective film 170, as shown in FIG. 4, the display panel is bent at the bent area BA, as shown in FIG. 5. Here, while the substrate 100 is bent at the bent area BA, although tensile stress may be applied to the first conductive layer 215c, occurrence of defects in the first conductive layer 215c during the bending process may be prevented or reduced in the display apparatus according to the embodiment.

If the first inorganic insulating layer including the buffer layer 110, the gate insulating layer 120, and/or the interlayer insulating layer 130 does not include the opening corresponding to the bent area BA, but instead continuously extends from the first area 1A to the second area 2A, and if the first conductive layer 215c is thereon, relatively large tensile stress is applied to the first conductive layer 215c during bending of the substrate 100. In particular, because the first inorganic insulating layer has greater rigidity/stiffness than that of the organic material layer 160, cracks are more likely to form in the first inorganic insulating layer in the bent area BA, and when a crack occurs in the first inorganic insulating layer, the crack may also occur in the first conductive layer 215c on the first inorganic insulating layer, and thus the probability of generating defects, such as disconnection in the first conductive layer 215c increases greatly.

However, according to the display apparatus of the embodiment, the first inorganic insulating layer includes the first opening corresponding to the bent area BA, and the part of the first conductive layer 215c, which corresponds to the bent area BA, is on the organic material layer 160 that at least partially fills the first opening of the first inorganic insulating layer. Because the first inorganic insulating layer includes the first opening corresponding to the bent area BA, the possibility of cracks occurring in the first inorganic insulating layer is reduced, and the organic material layer 160 is less likely to have cracks due to characteristics of the organic material. Therefore, the occurrence of cracks in the portion of the first conductive layer 215c on the organic material layer 160 may be prevented or reduced, wherein the portion of the first conductive layer 215c corresponds to the bent area BA. Because the organic material layer 160 has a lower hardness than that of an inorganic material layer, the organic material layer 160 may absorb the tensile stress generated due to the bending of the substrate 100 to reduce concentration of the tensile stress on the first conductive layer 215c.

In addition, when the display unit is formed, second conductive layers 213a and 213b may be formed, in addition to the first conductive layer 215c. The second conductive layers 213a and 213b may be formed in the first area 1A and/or the second area 2A (or respectively formed in the first and second areas 1A and 2A) at a different layer level than the first conductive layer 215c, and may be electrically connected to the first conductive layer 215c. In FIGS. 2 to 4, the second conductive layers 213a and 213b may include the same material as that of the gate electrode 213 of the thin film transistor 210, and are at the same layer as the gate electrode 213 (i.e., on the gate insulating layer 120). In addition, the first conductive layer 215c contacts the second conductive layers 213a and 213b via respective contact holes formed in the interlayer insulating layer 130. In addition, the second conductive layer 213a is located in the first area 1A, and the second conductive layer 213b is located in the second area 2A.

The second conductive layer 213a in the first area 1A may be electrically connected to the thin film transistor 210 within the display area DA, and accordingly, the first conductive layer 213c may be electrically connected to the thin film transistor 210 of the display area DA via the second conductive layer 213a. The second conductive layer 213b in the second area 2A may also be electrically connected to the thin film transistor of the display area DA via the first conductive layer 215c. As such, the second conductive layers 213a and 213b that are at an outer portion of the display area DA may be electrically connected to the elements in the display area DA, or may extend toward the display area DA so that at least some parts of the second conductive layers 213a and 213b may be located in the display area DA.

As described above, after the opening 170OP is formed in the protective film 170, as shown in FIG. 4, the display panel is bent at the bent area BA, as shown in FIG. 5. Here, because the substrate 100 is bent at the bent area BA, the tensile stress may be applied to the elements in the bent area BA.

Therefore, the first conductive layer 215c crossing over the bent area BA includes a material having high flexibility, so that defects such as cracks in the first conductive layer 215c or disconnection of the first conductive layer 215c may be prevented. In addition, the second conductive layers 213a and 213b including a material having an elongation rate that is lower than that of the first conductive layer 215c, and including electrical/physical characteristics that are different from those of the first conductive layer 215c, are formed in the first area 1A and/or the second area 2A, and thus, an efficiency of transferring electric signals may be improved, or a defect rate during the manufacturing processes of the display apparatus may be reduced. For example, the second conductive layers 213a and 213b may include molybdenum, and the first conductive layer 215c may include aluminum. The first conductive layer 215c and the second conductive layers 213a and 213b may have multi-layered structures, if suitable.

Unlike the example of FIGS. 2 to 4, at least a part of an upper portion of the second conductive layer 213b in the second area 2A may instead be uncovered by the planarization layer 140, and may instead be exposed to the outside to be electrically connected to various electronic devices or printed circuit boards.

In addition, as shown in FIGS. 2 to 4, the organic material layer 160 may have the uneven surface 160a at least partially in an upper surface thereof (in +z direction). Because the organic material layer 160 includes the uneven surface 160a, the first conductive layer 215c on the organic material layer 160 may include an upper surface and/or a lower surface having a shape corresponding to the uneven surface 160a of the organic material layer 160.

As described above, because the substrate 100 is bent at the bent area BA during the manufacturing processes, the tensile stress is applied to the first conductive layer 215c. Thus, when the upper surface and/or the lower surface of the first conductive layer 215c has the shape corresponding to the uneven surface 160a of the organic material layer 160, an amount of the tensile stress applied to the first conductive layer 215c may be reduced. That is, the tensile stress that may occur during the bending process may be reduced through deformation of the organic material layer 160 having a low rigidity/stiffness. At this time, the shape of the first conductive layer 215c having the uneven shape at least before the bending process is deformed to correspond to the shape of the organic material layer 160 changed due to the bending, and thus, generation of a defect, such as disconnection in the first conductive layer 215c, may be effectively prevented.

Also, the uneven surface 160a is formed at least partially at the upper surface of the organic material layer 160 (in +z direction), and thus, a surface area of the upper surface of the organic material layer 160, and respective surface areas of the upper and lower surfaces of the first conductive layer 215c within the first opening, may be increased. In addition, a relatively large surface area of the upper surface of the organic material layer 160 and the upper and lower surfaces of the first conductive layer 215c may enable a large deformation margin for reducing the tensile stress caused by the bending of the substrate 100.

Because the first conductive layer 215c is on the organic material layer 160, the lower surface of the first conductive layer 215c has a shape corresponding to the uneven surface 160a of the organic material layer 160. However, the upper surface of the first conductive layer 215c may have an uneven surface that does not correspond to the shape of the uneven surface 160a of the organic material layer 160.

The uneven surface 160a of the organic material layer 160 (in the +z direction) may be formed in various ways. For example, a photoresist material may be used to form the organic material layer 160, and an exposure amount may vary depending on locations of the upper surface of the organic material layer 160, which is in a flat state during the manufacturing processes, by using a slit mask or a half-tone mask so that a certain part may be etched (removed) relatively more than other parts. Here, the more etched part may be understood as a concave portion in the upper surface of the organic material layer 160. However, the forming of the organic material layer 160 in the display apparatus according to one or more embodiments is not limited to the above example. For example, after forming the organic material layer 160 having the upper surface that is flat, a certain portion may be removed by using a dry etching method.

For the organic material layer 160 to have the uneven surface 160a (in the +z direction), the organic material layer 160 may include a plurality of grooves extending in the first direction (+y direction) in the upper surface (in the +z direction) thereof. Here, the shape of the upper surface of the first conductive layer 215c on the organic material layer 160 corresponds to the shape of the upper surface of the organic material layer 160.

The organic material layer 160 may have the uneven surface 160a only within the first opening of the first inorganic insulating layer. In FIGS. 2 to 4, a width UEW of the uneven surface 160a of the organic material layer 160 is less than a width OW of the first opening of the first inorganic insulating layer. If the organic material layer 160 has the uneven surface 160a both inside and outside the first opening in the first inorganic insulating layer, the organic material layer 160 has the uneven surface 160a near the internal surface of the opening 110a in the buffer layer 110, the internal surface of the opening 120a in the gate insulating layer 120, or the internal surface of the opening 130a in the interlayer insulating layer 130. Because the organic material layer 160 has a relatively smaller thickness on depressed portions than on protruding portions, and thus, when the depressed portions are located around the internal surface of the opening 110a in the buffer layer 110, the internal surface of the opening 120a in the gate insulating layer 120, or the internal surface of the opening 130a in the interlayer insulating layer 130, the organic material layer 160 may be disconnected. Therefore, the organic material layer 160 may have the uneven surface 160a only within the first opening of the first inorganic insulating layer, and accordingly, the disconnection of the organic material layer 160 around the internal surface of the opening 110a in the buffer layer 110, the internal surface of the opening 120a of the gate insulating layer 120, or the internal surface of the opening 130a in the interlayer insulating layer 130 may be prevented.

As described above, to reduce the likelihood of generation of a disconnection in the first conductive layer 215c at the bent area BA, the organic material layer 160 may have the uneven surface 160a in the bent area BA. Therefore, an area of the uneven surface 160a of the organic material layer 160 may be greater than an area of the bent area BA, and may be smaller than the area of the first opening. That is, as shown in FIGS. 2 to 4, the width UEW of the uneven surface 160a of the organic material layer 160 is greater than the width of the bent area BA and smaller than the width OW of the first opening.

If at least one of the buffer layer 110, the gate insulating layer 120, and the interlayer insulating layer 130 includes an organic insulating material, the organic material layer 160 may be formed during a same process as (e.g., simultaneously with) the layer including the organic insulating material, and moreover, the layer including the organic insulating material and the organic material layer 160 may be integrally formed with each other. Examples of the organic insulating material may include polyethylene terephthalate, polyethylene naphthalate, polycarbonate, polyimide, polyethylene sulfonate, polyoxymethylene, polyarylate, and/or hexamethyldisiloxane.

The above-described structures with reference to FIGS. 2 to 4 may be applied to one or more embodiments that will be described later, and may be applied to modifications thereof.

Figure 7:
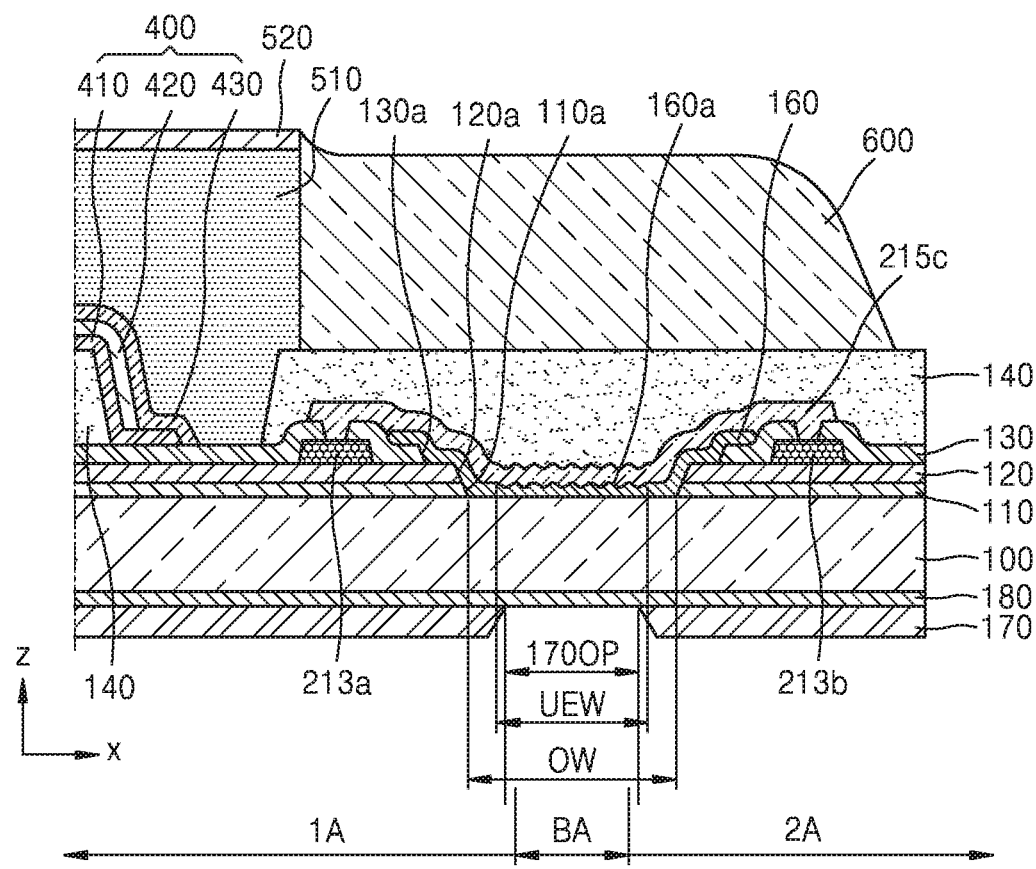
FIG. 7 is a schematic cross-sectional view of a part of a display apparatus according to an embodiment.

FIG. 7 is a schematic cross-sectional view of a part of a display apparatus according to an embodiment. For convenience of description, the display apparatus of FIG. 7 is not bent. In the cross-sectional views or plan views illustrating one or more embodiments that will be described later, the display apparatus is not in a bent state (e.g., not yet in a bent state) for convenience of description. In a case of the display apparatus described above with reference to FIG. 4, a width of the opening 170OP of the protective film 170 is equal to the width UEW of the uneven surface 160a in the organic material layer 160, but the embodiment is not limited thereto. For example, as shown in FIG. 7, the width of the opening 170OP of the protective film 170 may be less than the width UEW of the uneven surface 160a of the organic material layer 160.

As shown in FIGS. 3 and 4, when the opening 170OP is formed in the protective film 170 by irradiating a laser beam to a portion of the protective film 170 corresponding to the bent area BA, the adhesive layer 180 may remain in an area corresponding to the opening 170OP, as shown in FIGS. 4 to 7. Accordingly, the display apparatus includes the adhesive layer 180 interposed between the substrate 100 and the protective film 170, and the adhesive layer 180 may be integrally formed throughout the first area 1A, the bent area BA, and the second area 2A.

When the opening 170OP is formed by irradiating the laser beam to the protective film 170, the substrate 100 is not supposed to be damaged. Therefore, damage to the substrate 100 may be avoided by forming the opening 170OP in the protective film 170, and by ensuring that the adhesive layer 180 remains in the opening 170OP, rather than by removing the adhesive layer 180 between the protective film 170 and the substrate 100. That is, the adhesive layer 180 may protect a portion of the substrate 100, which corresponds to the opening 170OP, during the manufacturing processes. In addition, if the adhesive layer 180 includes a PSA, the stress generated in the adhesive layer 180 within the bent area BA may be reduced due to characteristics of the PSA even when the substrate 100 is bent at the bent area BA.

Figure 8:
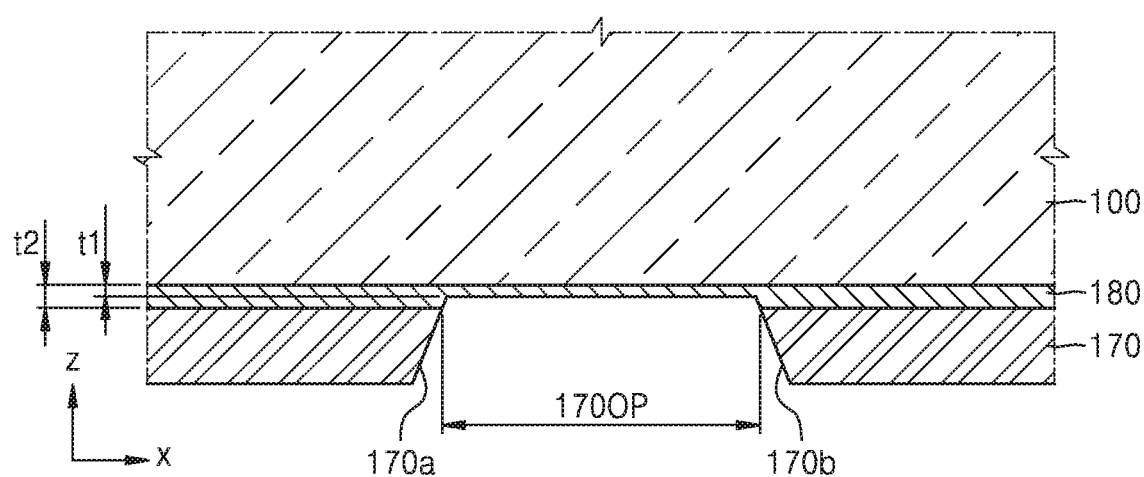
FIG. 8 is a schematic cross-sectional view of a part of a display apparatus according to an embodiment.

Here, the adhesive layer 180 may have a constant or consistent thickness throughout the first area 1A, the bent area BA, and the second area 2A. Otherwise, as shown in FIG. 8, which is a schematic cross-sectional view of a part of a display apparatus according to an embodiment, the adhesive layer 180 corresponding to the opening 170OP may be partially removed (e.g., thinned) when the opening 170OP is formed in the protective film 170. Accordingly, a thickness t1 of the adhesive layer 180 at a portion corresponding to the opening 170OP may be less than a thickness t2 of the adhesive layer 180 at portions/areas between the substrate 100 and the protective film 170. However, in this case, the adhesive layer 180, or at least a portion thereof, also remains in the opening 170OP of the protective film 170, and thus, damage to the substrate 100 may be prevented during forming the opening 170OP, and the adhesive layer 180 may protect the substrate 100 corresponding to the opening 170OP during the manufacturing processes.

Figure 9:
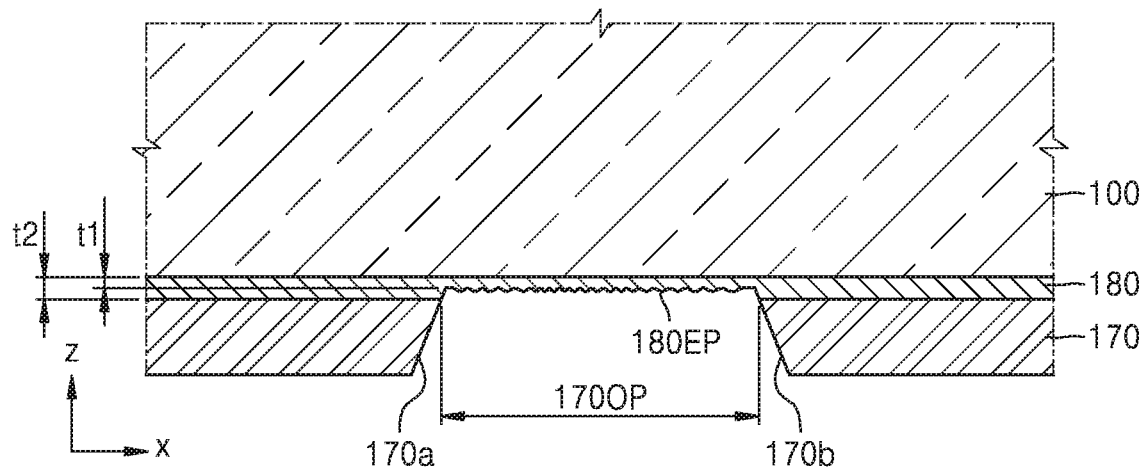
FIG. 9 is a schematic cross-sectional view of a part of a display apparatus according to an embodiment.

Also, as shown in FIG. 9, which is a schematic cross-sectional view of a part of a display apparatus according to an embodiment, the adhesive layer 180 may have an uneven surface 180EP (in the −z direction) corresponding to the opening 170OP. Here, the uneven portion is irregular, that is, a width, a height, and an interval of peaks and/or valleys of the uneven surface 180EP are not constant. As described above, because the adhesive layer 180 includes the uneven surface 180EP in the portion corresponding to the opening 170OP, the stress generated in the adhesive layer 180 when the substrate 100 is bent be dispersed instead of being concentrated at one point.

Figure 10:
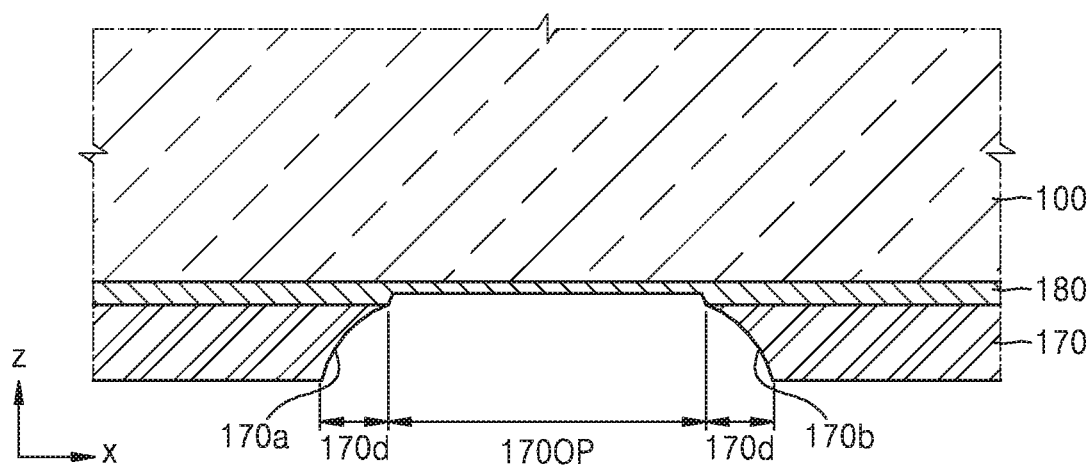
FIG. 10 is a schematic cross-sectional view of a part of a display apparatus according to an embodiment.

In FIGS. 7 to 9, the protective film 170 has the thickness around the opening 170OP, wherein the thickness is gradually smaller toward the opening 170OP at a constant rate. However, one or more embodiments are not limited thereto. As shown in FIG. 10, which is a schematic cross-sectional view of a part of a display apparatus according to an embodiment, in a part(s) 170d of the protective film 170 adjacent to the opening 170OP in the protective film 170, a thickness of the protective film 170 might not decrease at a constant rate. In particular, in the part(s) 170d, a rate of reduction of the thickness may decrease toward the opening 170OP. In this case, as shown in FIG. 10, inner side surfaces 170a and 170b at the opening 170OP in the protective film 170, along with the surface of the adhesive layer 180 within the opening 170OP, may form an entirely concave shape. Even in the structure shown in FIG. 10, the surface of the adhesive layer 180 corresponding to the opening 170OP might not be flat, but may instead have an uneven surface. Alternatively, the adhesive layer 180 may have a constant thickness throughout the first area 1A, the bent area BA, and the second area 2A.

Figure 11:
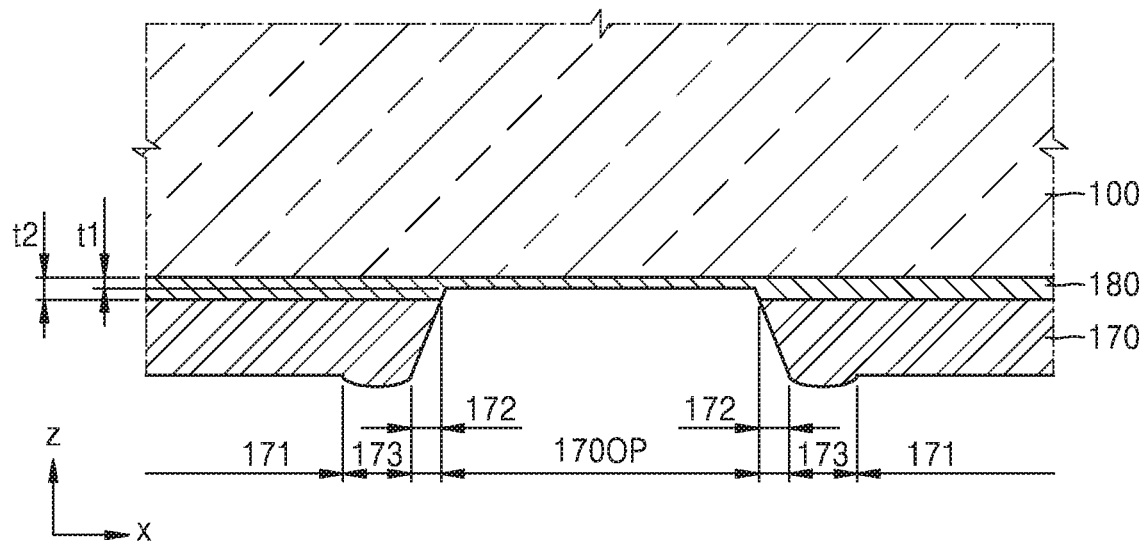
FIG. 11 is a schematic cross-sectional view of a part of a display apparatus according to an embodiment.

In addition, as shown in FIG. 3, when the opening 170OP is formed by irradiating the laser beam to the protective film 170, particles may be generated from a portion where the protective film 170 is removed, and the particles may be attached onto the protective film 170 around the opening 170OP. In this case, as shown in FIG. 11, which is a schematic cross-sectional view of a part of a display apparatus according to an embodiment, the protective film 170 has a first portion(s) 171 having a constant thickness, a second portion(s) 172 that is adjacent the opening 170OP and has a thickness that decreases toward the opening 170OP, and a third portion(s) 173 located between the first portion 171 and the second portion 172 that is thicker than the first portion 171. As described above, because the relatively thick third portion 173 is located around the opening 170OP of the protective film 170, degradation in the performance of the protective film 170 around the opening 170OP may be reduced or prevented. In this case, the adhesive layer 180 may also have an uneven surface (e.g., 180EP) in the part corresponding to the opening 170OP as shown in FIG. 9.

If suitable, a laser beam may be additionally irradiated to the third portion 173 to remove the particles, so that the third portion 173 is not present between the first portion 171 and the second portion 172. That is, the protective film 170 may have a constant thickness except at the second portion 172. In this case, because a bonding strength between particles, and a bonding strength between the particles and the surface of the protective film 170, are lower than a bonding strength between the elements in the protective film 170, only the particles may be removed without damaging the surface of the protective film 170.

Figure 12:
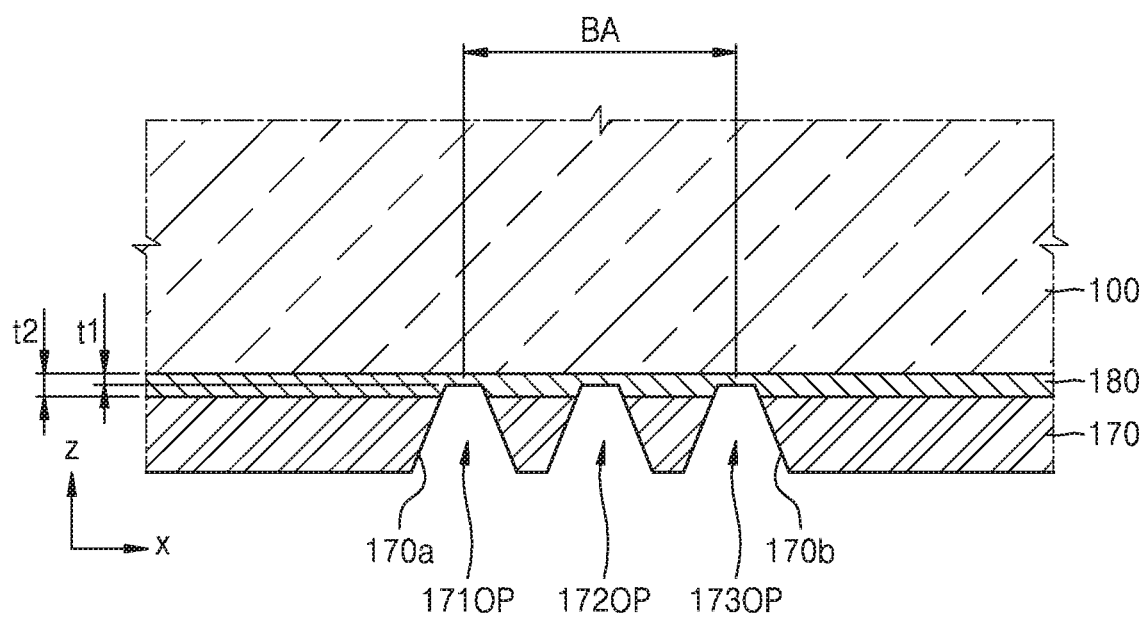
FIG. 12 is a schematic cross-sectional view of a part of a display apparatus according to an embodiment.

So far, a case in which the protective film 170 includes one opening 170OP corresponding to the bent area BA has been described, but one or more embodiments are not limited thereto. For example, as shown in FIG. 12, which is a schematic cross-sectional view of a part of a display apparatus according to an embodiment, the protective film 170 may include a plurality of openings 171OP, 172OP, and 173OP respectively corresponding to the bent area BA. Each of the plurality of openings 171OP, 172OP, and 173OP may extend in the first direction (+y direction), and may be implemented by irradiating the laser beam only to their corresponding parts.

In the display apparatus according to the embodiment, because the protective film 170 includes the plurality of openings 171OP, 172OP, and 173OP corresponding to the bent area BA, separation between the protective film 170 and the substrate 100 when the substrate 100 is bent may be prevented effectively. In this case, an inner side surface 170b in the second direction (+x direction) of the opening 173OP that is the last opening in the second direction (+x direction), and an inner side surface 170a of the opening 171OP that is the last opening in the direction toward the display area DA (the inner side surface 170a being in a direction toward the display area DA (−x direction) that is opposite to the second direction (+x direction)), may be inclined with respect to the lower surface of the substrate 100.

In FIG. 12, the thickness t1 of the adhesive layer 180 corresponding to the plurality of openings 171OP, 172OP, and 173OP is less than the thickness t2 of the adhesive layer 180 between the substrate 100 and the protective film 170. However, one or more embodiments are not limited thereto, and the thickness of the adhesive layer 180 may be constant throughout the first area 1A, the bent area BA, and the second area 2A.

Figure 13:
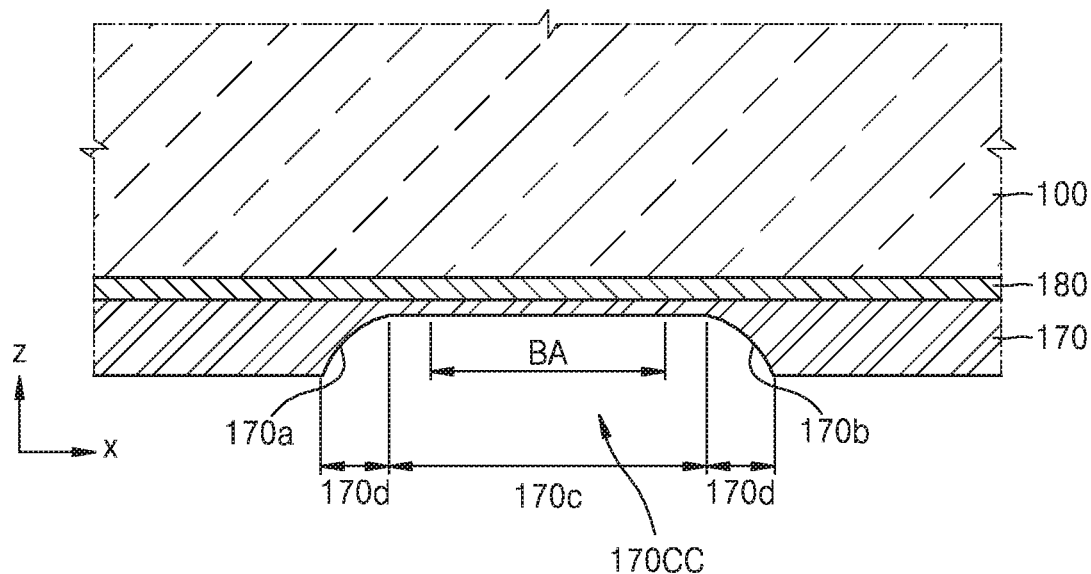
FIG. 13 is a schematic cross-sectional view of a part of a display apparatus according to an embodiment.

The protective film 170 has been described to have the opening 170OP above, but one or more embodiments are not limited thereto. For example, as shown in FIG. 13, which is a schematic cross-sectional view of a part of a display apparatus according to an embodiment, the protective film 170 may include a concave portion 170CC corresponding to the bent area BA. The concave portion 170CC may be implemented by not completely removing the portion of the protective film 170 corresponding to the bent area BA. The protective film 170 may have a first part 170d where a thickness of the concave portion is gradually reduced toward a center of the concave portion 170CC. For example, the thickness of the protective film 170 in the first part 170d may be gradually reduced toward the bending axis. Alternatively, the protective film 170 may have a second part 170c where the thickness of the concave portion is constant. In the latter case, the second part 170c may be located around the center of the concave portion 170CC.

Because the protective film 170 protects the lower surface of the substrate 100, the protective film 170 may have stiffness of its own (e.g., may be relatively rigid). Accordingly, if the protective film 170 has low flexibility, the protective film 170 may be separated from the substrate 100 when the substrate 100 is bent. However, according to the display apparatus of the embodiment, because the protective film 170 includes the concave portion 170CC corresponding to the bent area BA, the separation between the protective film 170 and the substrate 100 may be effectively prevented.

Figure 14:
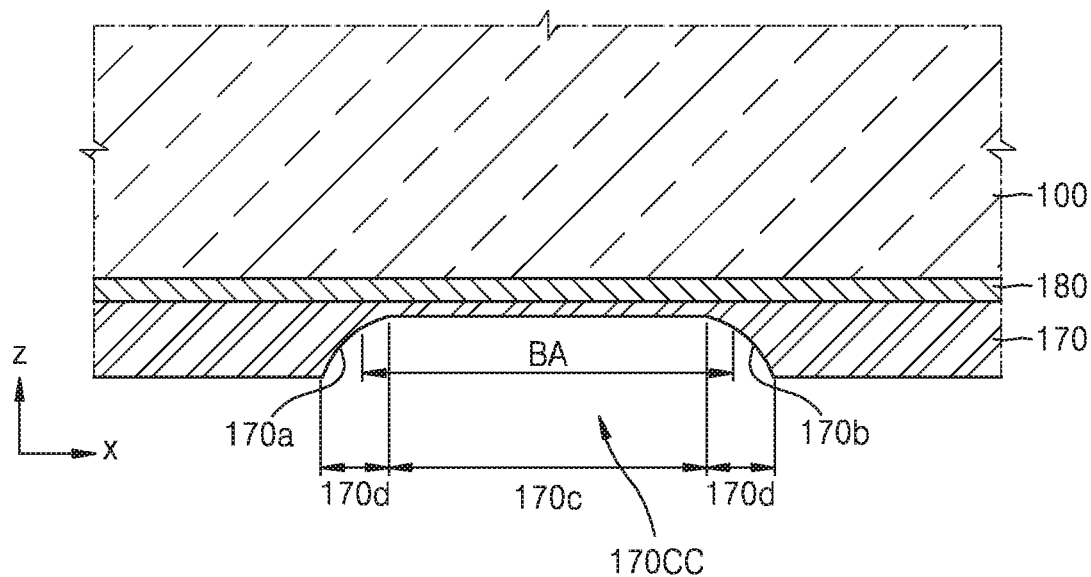
FIG. 14 is a schematic cross-sectional view of a part of a display apparatus according to an embodiment.

Here, the bent area BA may correspond to the concave portion 170CC as shown in FIG. 13. In particular, when the protective film 170 has the second part 170c having constant thickness around the center of the concave portion 170CC, the bent area BA may be at the second part 170c (e.g., width of the bent area BA is less than width of the second part 170c). Otherwise, as shown in FIG. 14, which is a schematic cross-sectional view of a part of a display apparatus according to an embodiment, the second part 170c may be located in the bent area BA, if suitable (e.g., width of the second part 170c is less than width of the bent area BA).

Figure 15:
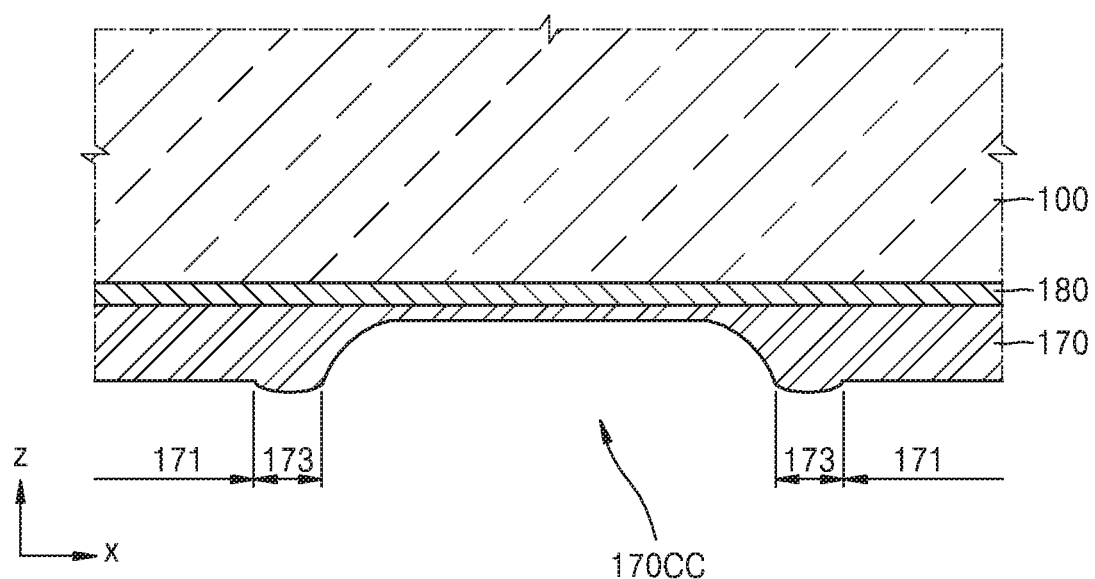
FIG. 15 is a schematic cross-sectional view of a part of a display apparatus according to an embodiment.

In the first part(s) 170d adjacent the second part 170c of the protective film 170, a rate of reduction of the thickness toward the center of the concave portion 170CC may not be constant. In detail, in the first part 170d, the reduction rate of the thickness may decrease toward the center of the concave portion 170CC. In addition, when the laser beam is irradiated to the protective film 170 to form the concave portion 170CC, particles may be generated from the portion where the protective film 170 is removed, and the particles may be attached onto the protective film 170 around the concave portion 170CC. In this case, as shown in FIG. 15, which is a schematic cross-sectional view of a part of a display apparatus according to an embodiment, the protective film 170 includes a first portion(s) 171 having a constant thickness, and a third portion(s) 173 located between the first portion 171 and the concave portion 170CC, and having a thickness that is greater than a thickness of the first portion 171. As described above, because the third portion 173 that is relatively thick is located around the concave portion 170CC of the protective film 170, degradation in performances of the protective film 170 around the concave portion 170CC may be prevented.

If suitable, the laser beam may be additionally irradiated to the third portion 173 to remove the attached particles, and the third portion 173 may be omitted. That is, the protective film 170 may have the constant thickness at portions other than the concave portion 170CC. In this case, because a bonding strength between the attached particles, and a bonding strength between the attached particles and the protective film 170, are lower than a coupling strength between the elements in the protective film 170, the attached particles may be removed without damaging the surface of the protective film 170.

The display apparatus is described above, but one or more embodiments are not limited thereto. For example, a method of manufacturing the above display apparatus may be also included in the scope of the one or more embodiments.

According to the one or more embodiments, the display apparatus capable of reducing manufacturing costs and a defect rate during the manufacturing processes may be implemented. However, the scope of the one or more embodiments is not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their functional equivalents.

What is claimed is:

1. A display apparatus comprising:
    a substrate comprising a bent area between a first area and a second area;
    a display unit over a first surface of the substrate at the first area;
    a protective film over a second surface of the substrate that is opposite to the first surface, and defining an opening corresponding to the bent area; and
    an adhesive layer between the substrate and the protective film, and in the opening,
    wherein the protective film comprises:
        a first first portion and a second first portion each having a first thickness;
        a first second portion and a second second portion each adjacent to a respective side of the opening, and each having a second thickness that decreases in a direction toward the opening; and
        a first third portion between the first first portion and the first second portion, and a second third portion between the second first portion and the second second portion each having a third thickness that is greater than the first thickness,
    wherein the first third portion and the second third portion are spaced apart from each other when the substrate is bent such that a portion of the substrate in the first area and a portion of the substrate in the second area are parallel to each other.

2. The display apparatus of claim 1, wherein the third thickness is greater than the second thickness.

3. The display apparatus of claim 1, wherein an inner surface of the opening is inclined with respect to the second surface of the substrate.

4. The display apparatus of claim 1, wherein the adhesive layer is integrally formed throughout the first area, the bent area, and the second area between the substrate and the protective film.

5. The display apparatus of claim 1, wherein the second thickness of the protective film gradually decreases in a direction toward the opening.

6. The display apparatus of claim 1, wherein the second thickness of the protective film decreases at an inconsistent rate in a direction toward the opening.

7. The display apparatus of claim 1, wherein the second thickness of the protective film decreases at a decreasing rate in a direction toward the opening.

8. The display apparatus of claim 1, wherein the bent area is in the opening.

9. The display apparatus of claim 1, wherein the adhesive layer is thinned in the opening such that a first portion of the adhesive layer corresponding to the opening has a thickness that is less than a thickness of a second portion of the adhesive layer between the substrate and the protective film.

* * * * *